US011251248B2

(12) United States Patent
Omoto et al.

(10) Patent No.: US 11,251,248 B2
(45) Date of Patent: Feb. 15, 2022

(54) DISPLAY APPARATUS

(71) Applicant: Sony Group Corporation, Tokyo (JP)

(72) Inventors: Keisuke Omoto, Kanagawa (JP); Masatsugu Tomida, Aichi (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 17/209,875

(22) Filed: Mar. 23, 2021

(65) Prior Publication Data

US 2021/0210576 A1    Jul. 8, 2021

Related U.S. Application Data

(63) Continuation of application No. 16/536,726, filed on Aug. 9, 2019, now Pat. No. 10,971,569, which is a (Continued)

(30) Foreign Application Priority Data

Apr. 13, 2009   (JP) ................................. 2009-097083

(51) Int. Cl.
*G09G 3/3233*   (2016.01)
*H01L 27/32*    (2006.01)
(Continued)

(52) U.S. Cl.
CPC ....... *H01L 27/3265* (2013.01); *G09G 3/3233* (2013.01); *H01L 27/124* (2013.01); (Continued)

(58) Field of Classification Search
CPC ......... G09G 3/3233; G09G 2300/0426; G09G 2300/0819; G09G 2300/0852; (Continued)

(56) References Cited

U.S. PATENT DOCUMENTS 5,541,748 A    7/1996 Ono et al.
5,714,885 A    2/1998 Lulham
(Continued)

FOREIGN PATENT DOCUMENTS

CN    1717132 A    1/2006
CN    1790733 A    6/2006
(Continued)

OTHER PUBLICATIONS

Japanese Office Action dated Feb. 21, 2013 for corresponding Japanese Application No. 2009-097083.
(Continued)

*Primary Examiner* — Stacy Khoo
(74) *Attorney, Agent, or Firm* — Michael Best & Friedrich LLP

(57) ABSTRACT

Disclosed herein is a display apparatus, including, a panel having a plurality of pixels disposed in a matrix and each including a self-luminous element for emitting light, the panel including first to third conductive layers laminated in order on a supporting substrate, a first contact portion between the first and second conductive layers and a second contact portion between the second and third conductive layers being disposed at the same position in a planar direction.

6 Claims, 11 Drawing Sheets

Related U.S. Application Data continuation of application No. 16/260,470, filed on Jan. 29, 2019, now Pat. No. 10,439,014, which is a continuation of application No. 15/646,464, filed on Jul. 11, 2017, now Pat. No. 10,217,805, which is a continuation of application No. 15/165,226, filed on May 26, 2016, now Pat. No. 9,716,133, which is a continuation of application No. 14/818,043, filed on Aug. 4, 2015, now Pat. No. 9,379,144, which is a continuation of application No. 12/659,441, filed on Mar. 9, 2010, now Pat. No. 9,123,292.

(51) Int. Cl.
*H01L 27/12* (2006.01)
*G09G 3/3291* (2016.01)

(52) U.S. Cl.
CPC ...... *H01L 27/1255* (2013.01); *H01L 27/3248* (2013.01); *H01L 27/3262* (2013.01); *H01L 27/3276* (2013.01); *G09G 3/3291* (2013.01); *G09G 2300/0426* (2013.01); *G09G 2300/0819* (2013.01); *G09G 2300/0852* (2013.01); *G09G 2300/0866* (2013.01); *G09G 2330/021* (2013.01); *H01L 27/1222* (2013.01)

(58) Field of Classification Search
CPC ..... G09G 2300/0866; G09G 2330/021; G09G 3/3291; H01L 27/124; H01L 27/1255; H01L 27/3248; H01L 27/3262; H01L 27/3265; H01L 27/3276; H01L 27/1222
See application file for complete search history.

(56) References Cited

U.S. PATENT DOCUMENTS

| | | | |
|---|---|---|---|
| 6,067,131 A | 5/2000 | Sato | |
| 6,104,597 A | 8/2000 | Konushi et al. | |
| 6,278,172 B1 | 8/2001 | Tominaga | |
| 6,559,651 B1 | 5/2003 | Crick | |
| 6,617,608 B2 | 9/2003 | Bae et al. | |
| 6,630,784 B2 | 10/2003 | Yoneda | |
| 6,632,711 B2 | 10/2003 | Sugano et al. | |
| 6,757,032 B1 | 6/2004 | Zhang et al. | |
| 7,932,137 B2 | 4/2011 | Tanabe | |
| 9,123,292 B2 | 9/2015 | Omoto et al. | |
| 9,716,133 B2 | 7/2017 | Omoto et al. | |
| 2002/0060321 A1 | 5/2002 | Kazlas et al. | |
| 2003/0107072 A1 | 6/2003 | Fujimori | |
| 2003/0117552 A1 | 6/2003 | Chae | |
| 2003/0214245 A1 | 11/2003 | Yamazaki et al. | |
| 2003/0227262 A1 | 12/2003 | Kwon | |
| 2004/0046164 A1 | 3/2004 | Kobayashi et al. | |
| 2004/0070557 A1 | 4/2004 | Asano et al. | |
| 2005/0116631 A1 | 6/2005 | Kim et al. | |
| 2005/0156179 A1 | 7/2005 | Yamagata | |
| 2005/0206590 A1 | 9/2005 | Sasaki et al. | |
| 2005/0269639 A1 | 12/2005 | Yamazaki et al. | |
| 2005/0285197 A1 | 12/2005 | Park | |
| 2006/0038176 A1 | 2/2006 | Akimoto et al. | |
| 2006/0066644 A1 | 3/2006 | Yamaguchi et al. | |
| 2006/0132055 A1 | 6/2006 | Kwak | |
| 2006/0138922 A1 | 6/2006 | Kim et al. | |
| 2006/0154422 A1 | 7/2006 | Chun et al. | |
| 2007/0096097 A1 | 5/2007 | Kim et al. | |
| 2007/0152925 A1 | 7/2007 | Osame et al. | |
| 2007/0262352 A1 | 11/2007 | Hirabayashi et al. | |
| 2007/0273619 A1 | 11/2007 | Kitazawa et al. | |
| 2008/0001545 A1 | 1/2008 | Uchino et al. | |
| 2008/0030437 A1 | 2/2008 | Iida et al. | |
| 2008/0038529 A1 | 2/2008 | Nakayama et al. | |
| 2008/0079670 A1 | 4/2008 | Asano | |
| 2008/0150437 A1 | 6/2008 | Iida et al. | |
| 2008/0231576 A1 | 9/2008 | Yamamoto et al. | |
| 2008/0246026 A1 | 10/2008 | Kim | |
| 2008/0246403 A1* | 10/2008 | Sagawa | G09G 3/3233 315/35 |
| 2008/0308821 A1 | 12/2008 | Hsu | |
| 2009/0001896 A1 | 1/2009 | Yamazaki et al. | |
| 2009/0009496 A1 | 1/2009 | Kwak et al. | |
| 2009/0140270 A1 | 6/2009 | Takahashi et al. | |
| 2010/0025664 A1 | 2/2010 | Park | |

FOREIGN PATENT DOCUMENTS

| | | |
|---|---|---|
| CN | 101266754 A | 9/2008 |
| CN | 101312007 A | 11/2008 |
| JP | H06-244131 A | 9/1994 |
| JP | 2003-255856 A | 9/2003 |
| JP | 2003-271095 A | 9/2003 |
| JP | 2004-029791 A | 1/2004 |
| JP | 2004-093682 A | 3/2004 |
| JP | 2004-133240 A | 4/2004 |
| JP | 2005-091495 A | 4/2005 |
| JP | 2006-018225 A | 1/2006 |
| JP | 2006-173617 A | 6/2006 |
| JP | 2008-287196 A | 11/2008 |

OTHER PUBLICATIONS

Japanese Office Action dated Oct. 8, 2013 for corresponding Japanese Application No. 2009-097083.
Chinese Office Action dated Sep. 2, 2014 for corresponding Chinese Application No. 201310120565.9.
Chinese Office Action dated Sep. 4, 2014 for corresponding Chinese Application No. 201310120563.
Chinese Office Action dated Apr. 27, 2015 for corresponding Chinese Application No. 201310120565.9.

* cited by examiner

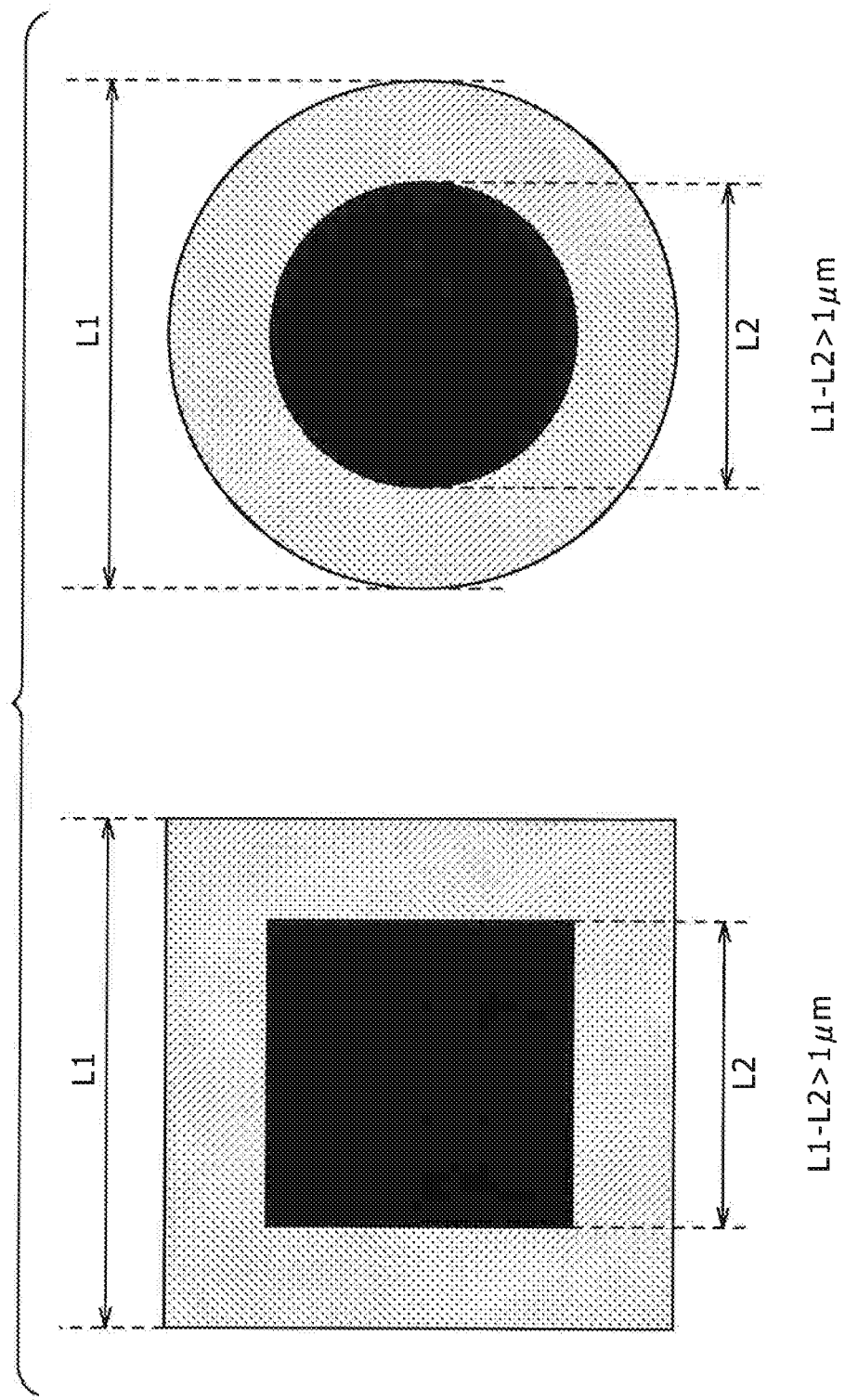

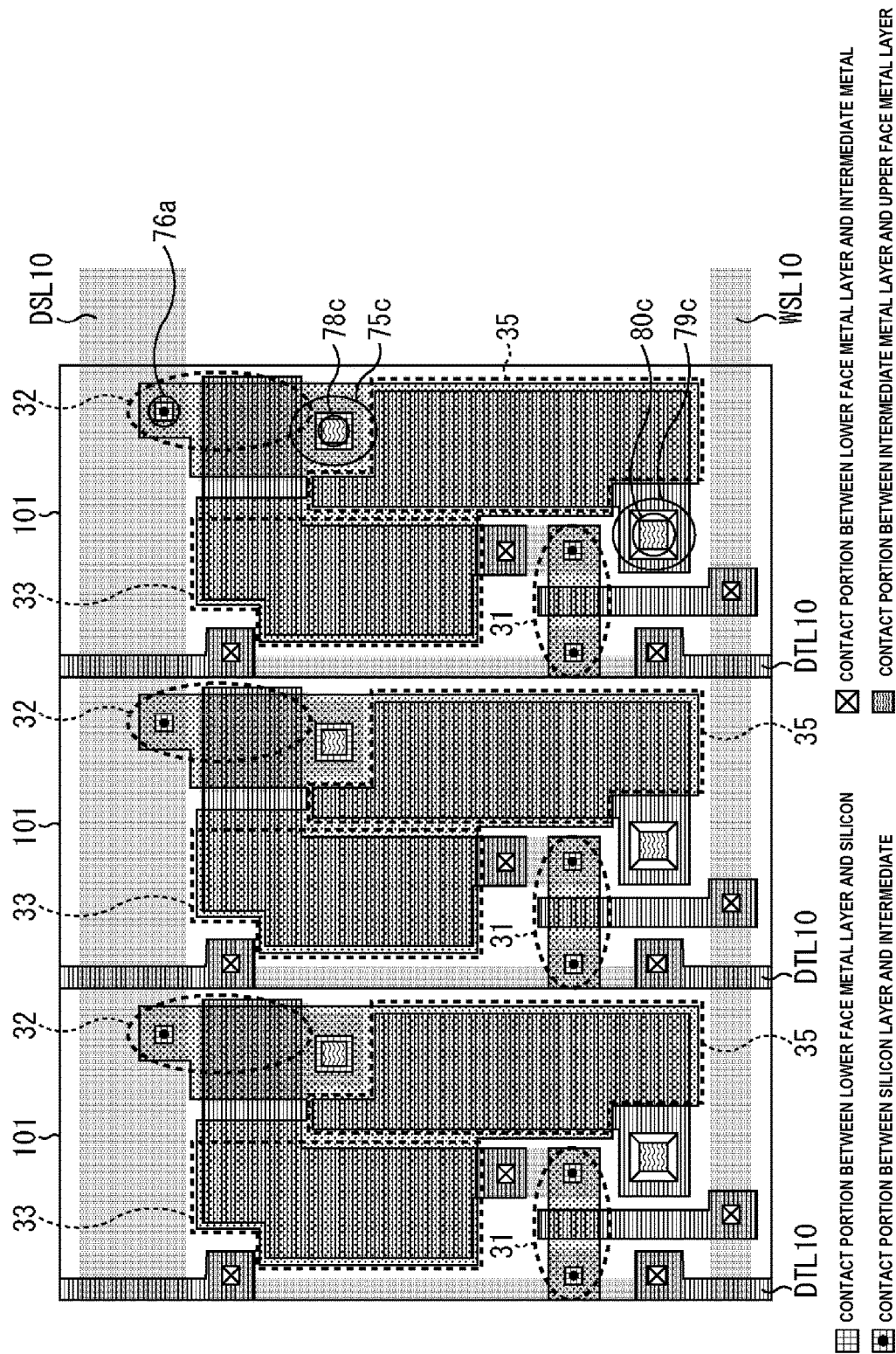

DISPLAY APPARATUS

CROSS REFERENCE TO RELATED APPLICATIONS

This application is a Continuation Application of application Ser. No. 16/536,726, filed Aug. 9, 2019, which is a Continuation Application of application Ser. No. 16/260,470, filed Jan. 29, 2019, now U.S. Pat. No. 10,439,014, issued on Oct. 8, 2019, which is a Continuation Application of application Ser. No. 15/646,464, filed Jul. 11, 2017, now U.S. Pat. No. 10,217,805, issued on Feb. 26, 2019, which is a Continuation Application of application Ser. No. 15/165,226, filed May 26, 2016, now U.S. Pat. No. 9,716,133, issued on Jul. 25, 2017, which is a Continuation Application of application Ser. No. 14/818,043, filed Aug. 4, 2015, now U.S. Pat. No. 9,379,144, issued on Jun. 28, 2016, which is a Continuation Application of application Ser. No. 12/659,441, filed Mar. 9, 2010, now U.S. Pat. No. 9,123,292, issued Sep. 1, 2015, which claims priority to Japanese Priority Patent Application JP 2009-097083, filed in the Japan Patent Office on Apr. 13, 2009, the entire contents of which are hereby incorporated by reference.

BACKGROUND OF THE INVENTION

1. Field of the Invention

This invention relates to a display apparatus, and more particularly to a display apparatus which includes a conductive layer having two contact portions.

2. Description of the Invention

A panel of the planar self-luminous type which uses an organic electroluminescence (EL) device as a light emitting element has been and is being developed energetically in recent years. The organic EL device has a diode characteristic and utilizes a phenomenon that, if an electric field is applied to an organic thin film, then the organic thin film emits light. Since the organic EL device is a self-luminous device whose power consumption is low because it is driven by an applied voltage less than or equal to 10 V and which itself emits light. Therefore, the organic EL device has a characteristic that it does not require an illuminating member and reduction in weight and thickness is easy. Further, since the response speed of the organic EL device is as high as approximately several μs, the EL panel has an advantage that an after-image upon display of a dynamic image does not appear.

Among various EL panels, a panel of the active matrix type wherein a thin film transistor (TFT) as a driving element is formed in an integrated state in each pixel is being developed energetically. An active matrix EL panel is disclosed, for example, in Japanese Patent Laid-Open Nos. 2003-255856, 2003-271095, 2004-133240, 2004-029791 and 2004-093682.

For active matrix EL panels in recent years, enhancement in definition is demanded.

SUMMARY OF THE INVENTION

However, in a known active matrix EL panel, where it is necessary to use one conductive layer to establish contact between two other conductive layers, the two contact portions are disposed at positions spaced from each other in a planar direction in order to prevent contact failure. Therefore, the conductive layer having the two contact portions is obliged to have a great area, and a region of one pixel cannot be utilized effectively.

Therefore, it is desirable to provide a display apparatus wherein the area of one conductive layer having two contact portions can be reduced.

According to an embodiment of the present invention, there is provided a display circuit including a panel having a plurality of pixels disposed in a matrix and each including a self-luminous element for emitting light, the panel including first to third conductive layers laminated in order on a supporting substrate, a first contact portion between the first and second conductive layers and a second contact portion between the second and third conductive layers being disposed at the same position in a planar direction.

In the display apparatus, the first to third conductive layers included in the panel on which the pixels each having the self-luminous element for emitting light are disposed in a matrix are laminated in order on the supporting substrate. Further, the first contact portion between the first and second conductive layers and the second contact portion between the second and third conductive layers are disposed at the same position in a planar direction.

With the display apparatus, the area of that one of the conductive layers which has the two contact portions can be reduced.

BRIEF DESCRIPTION OF THE DRAWINGS

FIG. 10 is a top plan view of a contact portion shown in FIG. 9; and

FIG. 11 is a plan view of the EL panel shown in FIG. 1.

DETAILED DESCRIPTION OF THE PREFERRED EMBODIMENT

[Configuration of the Display Apparatus]

Figure 1:
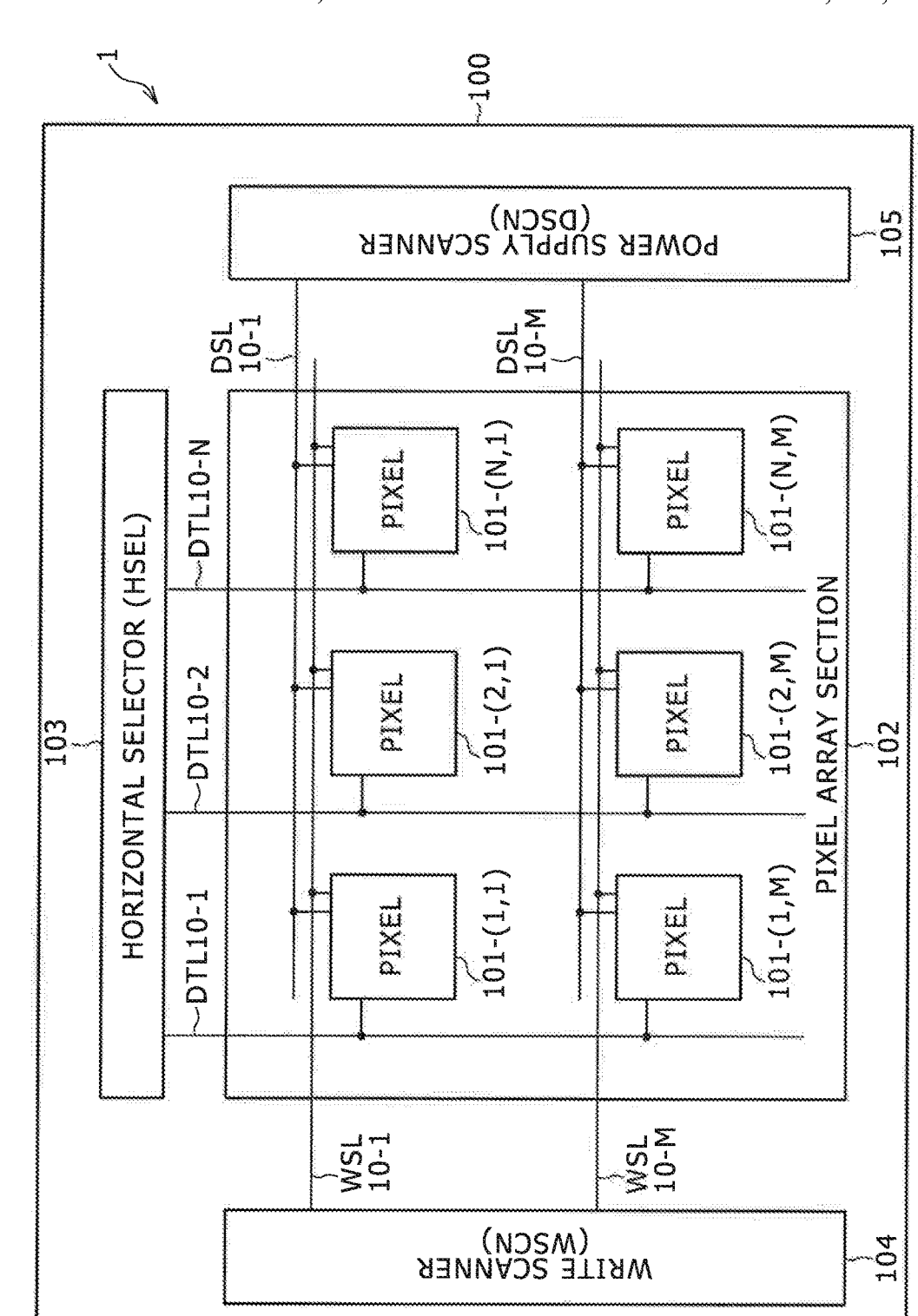
FIG. 1 is a block diagram showing an example of a configuration of a display apparatus to which an embodiment of the present invention is applied.

FIG. 1 shows an example of a configuration of a display apparatus to which an embodiment of the present invention is applied.

Referring to FIG. 1, the display apparatus 1 shown is, for example, a television receiver and displays an image corresponding to an image signal inputted thereto on an EL panel 100. The EL panel 100 uses an organic EL (electroluminescence) device as a self-luminous element. The EL panel 100 is incorporated as a panel module, which includes a driver IC (integrated circuit) including source drivers and gate drivers, in the display apparatus 1. The display apparatus 1 further includes a power supply circuit, an image LSI (Large Scale Integration) and so forth not shown. It is to be noted that the EL panel 100 of the display apparatus 1 can be utilized also as a display section for a portable telephone set, a digital still camera, a digital video camera, a printer and so forth.

The EL panel 100 includes a pixel array section 102 having a plurality of pixels 101, a horizontal selector (HSEL) 103, a write scanner (WSCN) 104 and a power supply scanner (DSCN) 105.

In the pixel array section 102, N×M (N and M are integral values higher than 1 and independent of each other) pixels 101-(1,1) to 101-(N,M) are disposed in an array. It is to be noted that, from a restriction in illustration, only some of the pixels 101-(1,1) to 101-(N,M) are shown in FIG. 1.

The EL panel 100 further includes M scanning lines WSL10-1 to WSL10-M, M power supply lines DSL10-1 to DSL10-M and N image signal lines DTL10-1 to DTL10-N.

It is to be noted that, in the following description, where there is no necessity to specifically distinguish the scanning lines WSL10-1 to WSL10-M, each of them is referred to simply as scanning line WSL10. Further, where there is no necessity to specifically distinguish the image signal lines DTL10-1 to DTL10-N, each of them is referred to simply as image signal line DTL10. Further, where there is no necessity to specifically distinguish the pixels 101-(1,1) to 101-(N,M) and the power supply lines DSL10-1 to DSL10-M, each of them is referred to simply as pixel 101 and power supply line DSL10, respectively.

The horizontal selector 103, write scanner 104 and power supply scanner 105 operate as a driving section for driving the pixel array section 102.

The pixels 101-(1,1) to 101-(N,1) in the first row from among the pixels 101-(1,1) to 101-(N,M) are connected to the write scanner 104 and the power supply scanner 105 by the scanning line WSL10-1 and the power supply line DSL10-1, respectively. Further, the pixels 101-(1,M) to 101-(N,M) of the Mth row from among the pixels 101-(1,1) to 101-(N,M) are connected to the write scanner 104 and the power supply scanner 105 by the scanning line WSL10-M and the power supply line DSL10-M, respectively. Also the other pixels 101 juxtaposed in the direction of a row in the pixels 101-(1,1) to 101-(N,M) are connected in a similar connection scheme.

Further, the pixels 101-(1,1) to 101-(1,M) in the first column from among the pixels 101-(1,1) to 101-(N,M) are connected to the horizontal selector 103 by the image signal line DTL10-1. The pixels 101-(N,1) to 101-(N,M) in the Nth column from among the pixels 101-(1,1) to 101-(N,M) are connected to the horizontal selector 103 by the image signal line DTL10-N. Also the other pixels 101 juxtaposed in the column direction from among the pixels 101-(1,1) to 101-(N,M) are connected in a similar connection scheme.

The write scanner 104 supplies sequential selection control signals to the scanning lines WSL10-1 to WSL10-M in a horizontal period (1H) to line-sequentially scan the pixels 101 in a unit of a row. The power supply scanner 105 supplies a power supply voltage of a first potential Vcc or a second potential Vss illustrated in FIG. 4 to the power supply lines DSL10-1 to DSL10-M in synchronism with the line-sequential scanning. The horizontal selector 103 supplies a signal potential Vsig corresponding to an image signal and a reference potential Vofs illustrated in FIG. 4 switchably to the image signal lines DTL10-1 to DTL10-M in the columns within each horizontal period (1H) in synchronism with the line-sequential scanning.

[Array Configuration of the Pixels 101]

Figure 2:
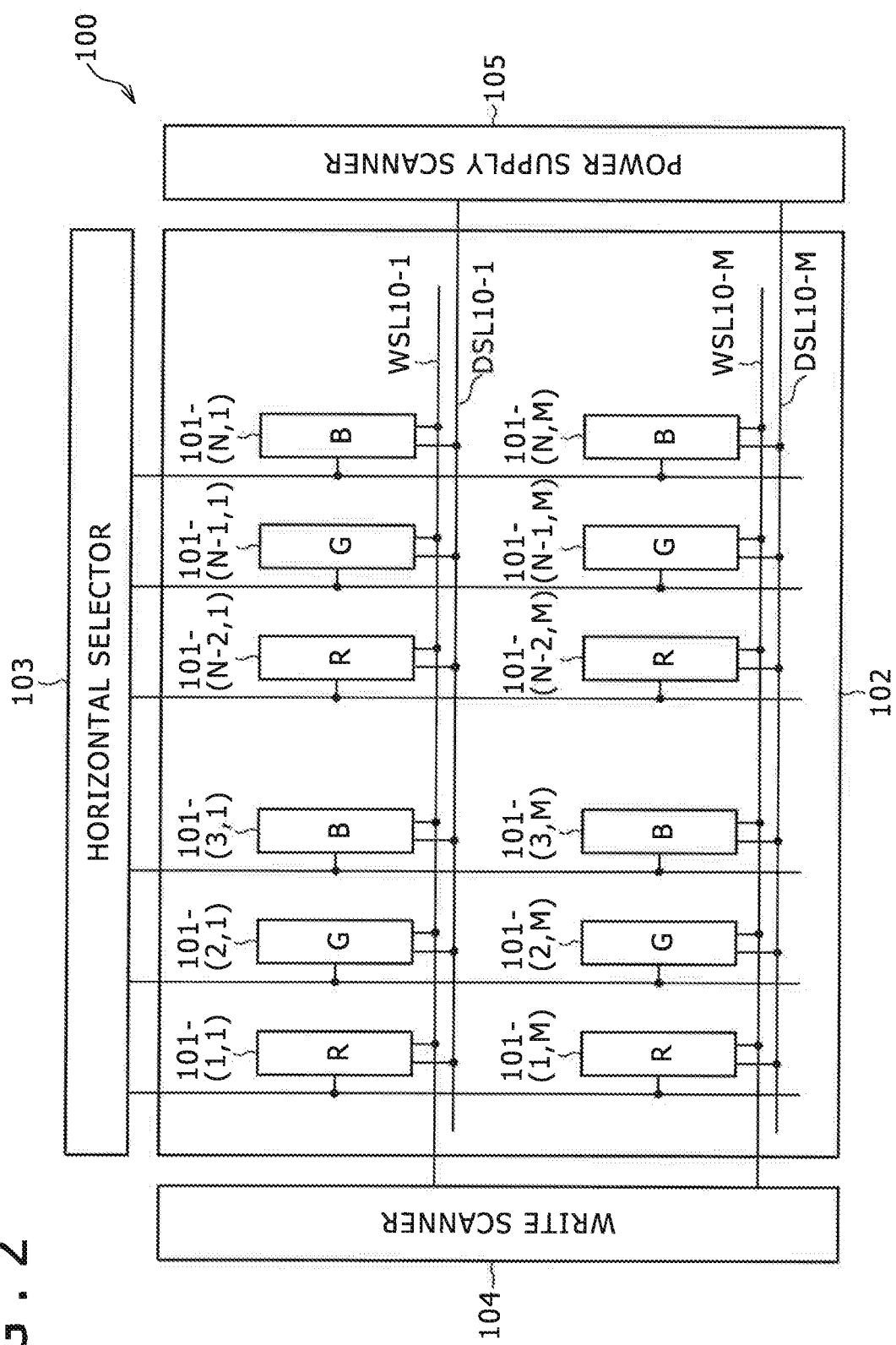
FIG. 2 is a block diagram showing an array of colors of pixels of an EL panel shown in FIG. 1.

FIG. 2 shows an array of colors of light emitted from the pixels 101 of the EL panel 100.

It is to be noted that FIG. 2 is different from FIG. 1 in that the scanning lines WSL10 and the power supply lines DSL10 are shown connected to the pixels 101 from the lower side. To which side of the pixels 101 the scanning lines WSL10, power supply lines DSL10 and image signal lines DTL10 are connected can be changed suitably in accordance with the wiring line layout. Also the arrangement of the horizontal selector 103, write scanner 104 and power supply scanner 105 with respect to the pixel array section 102 can be suitably changed similarly.

Each of the pixels 101 of the pixel array section 102 emits light of one of the primary colors of red (R), green (G) and blue (B). The colors are arrayed such that, for example, red, green and blue are arrayed in order in the direction of a row, but in the direction of a column, the same color appears in the same column. Accordingly, the pixels 101 correspond to so-called subpixels, and one pixel as a unit of display is formed from three pixels 101 of red, green and blue juxtaposed in the direction of a row, that is, in the leftward and rightward direction in FIG. 2. It is to be noted that the array of colors of the EL panel 100 is not limited to the specific array shown in FIG. 2.

[Detailed Circuit Configuration of the Pixels 101]

Figure 3:
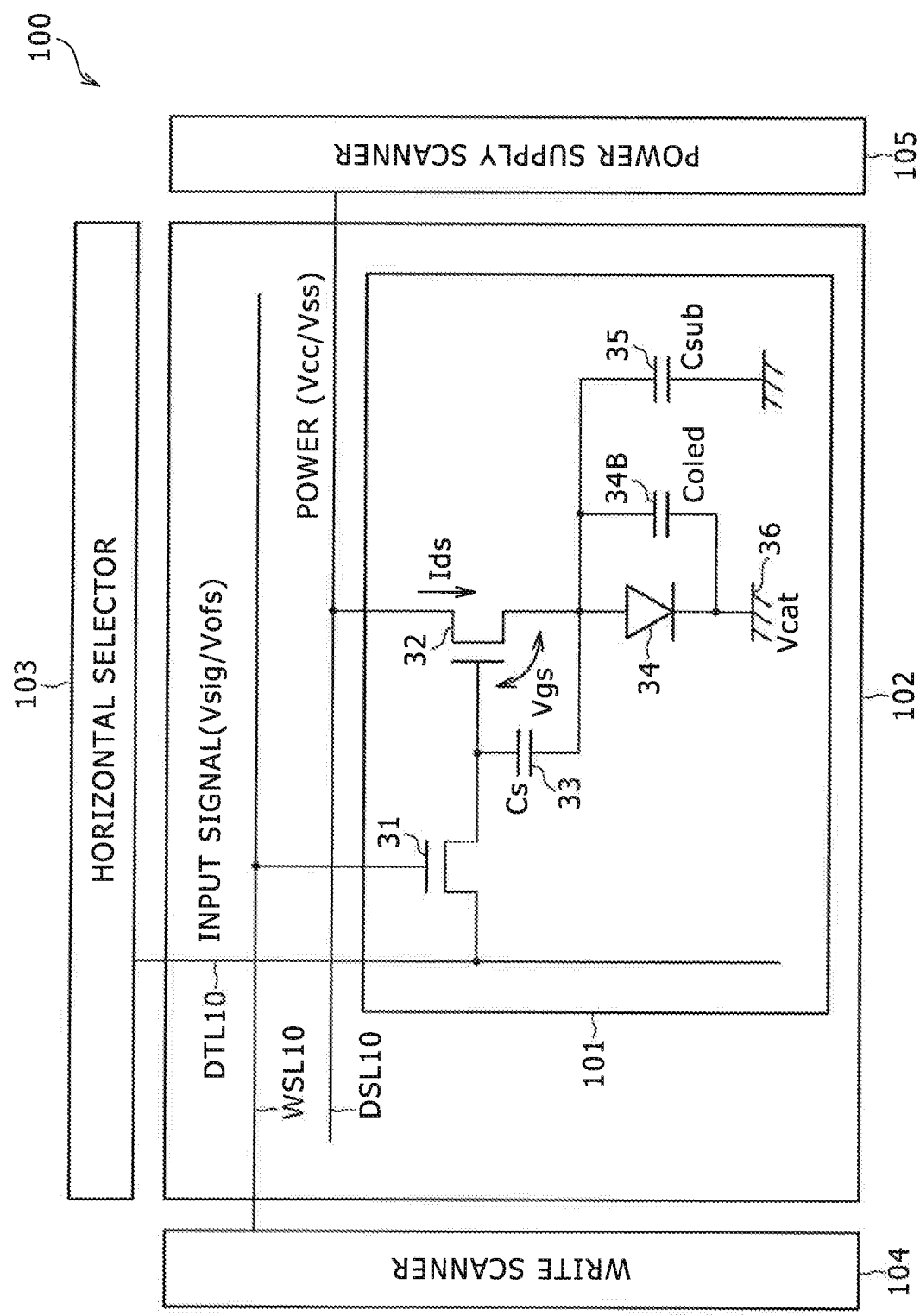
FIG. 3 is a block diagram showing a configuration of an equivalent circuit of a pixel of the display apparatus of FIG. 1.

FIG. 3 shows a configuration of an equivalent circuit of a pixel circuit of one of the N×M pixels 101 included in the EL panel 100.

It is to be noted that, if the pixel 101 shown in FIG. 3 is a pixel 101-($n$, $m$) ($n$=1, 2, . . . , N and $m$=1, 2, . . . , M), then the scanning line WSL10, image signal line DTL10 and power supply line DSL10 are such as follows. In particular, the scanning line WSL10, image signal line DTL10 and power supply line DSL10 are the scanning line WSL10-$n$, image signal line DTL10-$n$ and power supply line DSL10-$m$ corresponding to the pixel 101-($n$,$m$), respectively.

The pixel 101 shown in FIG. 3 includes a sampling transistor 31, a driving transistor 32, an accumulating capacitor 33, a light emitting element 34, and an auxiliary capacitor 35. Further, in FIG. 3, also a capacitance component which the light emitting element 34 has is shown as a light emitting element capacitor 34B. Here, the accumulating capacitor 33, light emitting element capacitor 34B and auxiliary capacitor 35 have capacitance values Cs, Coled and Csub, respectively.

The sampling transistor 31 is connected at the gate thereof to the scanning line WSL10 and at the drain thereof to the image signal line DTL10. Further, the sampling transistor 31 is connected at the source thereof to the gate of the driving transistor 32.

The driving transistor 32 is connected at one of the source and the drain thereof to the anode of the light emitting element 34 and at the other of the source and the drain thereof to the power supply line DSL10. The accumulating capacitor 33 is connected between the gate of the driving transistor 32 and the anode of the light emitting element 34. Further, the light emitting element 34 is connected at the cathode thereof to a wiring line 36 which is set to a predetermined potential Vcat. The potential Vcat is the ground (GND) level, and accordingly, the wiring line 36 is a grounding line.

The auxiliary capacitor 35 is provided to supplement the capacitance component of the light emitting element 34, that is, the light emitting element capacitor 34B and is connected in parallel to the light emitting element 34. In particular, the auxiliary capacitor 35 is connected at one of electrodes thereof to the anode side of the light emitting element 34 and at the other electrode thereof to the cathode side of the light emitting element 34. Where the auxiliary capacitor 35 is provided and retains a predetermined potential in this manner, the input gain of the driving transistor 32 can be improved. Here, the input gain of the driving transistor 32 is a ratio of a rise amount of the source potential Vs with respect to a rise amount of the gate potential Vg of the driving transistor 32 within a writing+mobility correction period $T_5$ hereinafter described with reference to FIG. 4.

The sampling transistor 31 and the driving transistor 32 are N-channel transistors. Therefore, the sampling transistor 31 and the driving transistor 32 can be formed from amorphous silicon which can be produced at a lower cost than low temperature polycrystalline silicon. Consequently, the pixel circuit can be produced at a reduced cost. Naturally, the sampling transistor 31 and the driving transistor 32 may otherwise be formed from low temperature polycrystalline silicon or single crystal silicon.

The light emitting element 34 is formed from an organic EL element. The organic EL element is a current-driven light emitting element having a diode characteristic. Therefore, the light emitting element 34 emits light of a gradation which depends upon the current value Ids supplied thereto.

In the pixel 101 configured in such a manner as described above, the sampling transistor 31 is turned on or rendered conducting in response to a selection control signal from the scanning line WSL10 and samples an image signal of the signal potential Vsig corresponding to a gradation through the image signal line DTL10. The accumulating capacitor 33 accumulates and retains charge supplied thereto from the horizontal selector 103 through the image signal line DTL10. The driving transistor 32 is supplied with current from the power supply line DSL10 having the first potential Vcc and supplies driving current Ids to the light emitting element 34 in response to the signal potential Vsig retained in the accumulating capacitor 33. The predetermined driving current Ids flows to the light emitting element 34, and the pixel 101 emits light.

The pixel 101 has a threshold value correction function. The threshold value correction function is a function of causing the accumulating capacitor 33 to retain a voltage corresponding to a threshold voltage Vth of the driving transistor 32. Where the threshold value correction function is exhibited, an influence of the threshold voltage Vth of the driving transistor 32 which makes a cause of a dispersion for each pixel of the EL panel 100 can be canceled.

The pixel 101 has a mobility correction function in addition to the threshold value correction function described above. The mobility correction function is a function of applying, when the signal potential Vsig is retained in the accumulating capacitor 33, correction to the mobility μ of the driving transistor 32.

Furthermore, the pixel 101 has a bootstrap function. The bootstrap function is a function of causing the gate potential Vg to interlock with the variation of the source potential Vs of the driving transistor 32. Where the bootstrap function is exhibited, the voltage Vgs between the gate and the source of the driving transistor 32 can be maintained fixed.

[Operation of the Pixel 101]

Figure 4:
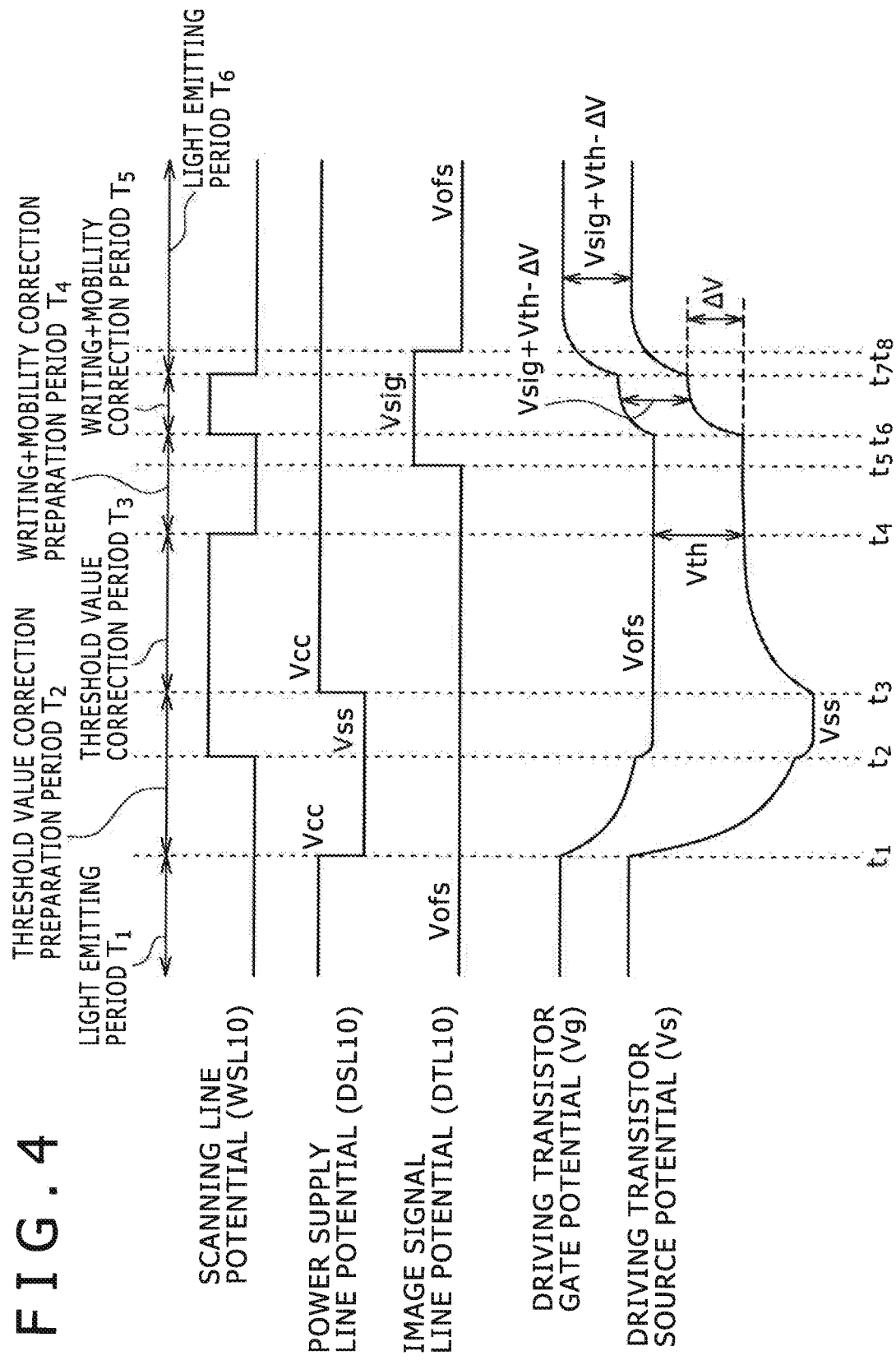
FIG. 4 is a timing chart illustrating operation of the panel of the display apparatus of FIG. 1.

FIG. 4 illustrates operation of the pixel 101.

In particular, FIG. 4 illustrates a voltage variation of the scanning line WSL10, power supply line DSL10 and image signal line DTL10 with respect to the same time axis, which extends in the horizontal direction in FIG. 4 and a corresponding variation of the gate potential Vg and the source potential Vs of the driving transistor 32.

Referring to FIG. 4, the period to time $t_1$ is a light emitting period $T_1$ within which emission of light in the preceding horizontal period (1H) continues.

A period from time $t_1$ at which the light emitting period $T_1$ ends to time $t_2$ is a threshold value correction preparation period $T_3$ within which the gate potential Vg and the source potential Vs of the driving transistor 32 are initialized to make preparations for a threshold voltage correction operation.

Within the threshold value correction preparation period $T_2$, at time $t_1$, the power supply scanner 105 changes over the potential of the power supply line DSL from the first potential Vcc which is a high potential to the second potential Vss which is a low potential. Here, the threshold voltage of the light emitting element 34 is represented by Vthel. At this time, if the second potential Vss is set so as to satisfy Vss<Vthel+Vcat, then since the source potential Vs of the driving transistor 32 becomes substantially equal to the second potential Vss, the light emitting element 34 is placed into a reversely biased state and stops emission of light.

Then at time $t_2$, the write scanner 104 changes over the potential of the scanning line WSL to a high potential to turn on the sampling transistor 31. Consequently, the gate potential Vg of the driving transistor 32 is reset to the reference potential Vofs, and besides the source potential Vs is reset to the second potential Vss of the image signal line DTL.

At this time, the gate-source voltage Vgs of the driving transistor 32 becomes Vofs-Vss. Here, if Vofs-Vss is not greater than the threshold voltage Vth of the driving transistor 32, then a next threshold value correction process cannot be carried out. Therefore, the reference potential Vofs and the second potential Vss are set so as to satisfy a relationship of Vofs-Vss>Vth.

A period from time $t_3$ to time $t_4$ is a threshold value correction period $T_3$ within which a threshold value correction operation is carried out. Within the threshold value correction period $T_3$, at time $t_3$, the potential of the power supply line DSL is changed over to the first potential Vcc by the power supply scanner 105, and a voltage corresponding to the threshold voltage Vth is written into the accumulating capacitor 33 connected between the gate and the source of the driving transistor 32. In particular, as the potential of the power supply line DSL is changed over to the first potential Vcc, the source potential Vs of the driving transistor 32 rises and the gate-source voltage Vgs of the driving transistor 32 becomes equal to the threshold voltage Vth before time $t_4$ within the threshold value correction period $T_3$.

It is to be noted that, since the potential Vcat is set so that the light emitting element 34 is placed into a cutoff state within the threshold value correction period $T_3$, the drain-source current Ids of the driving transistor 32 flows to the accumulating capacitor 33 side but not to the light emitting element 34 side.

Within a writing+mobility correction preparation period $T_4$ from time $t_4$ to time $t_6$, the potential of the scanning line WSL is changed over from the high potential to the low potential. At this time, since the sampling transistor 31 is turned off, the gate of the driving transistor 32 is placed into a floating state. However, since the gate-source voltage Vgs of the driving transistor 32 is equal to the threshold voltage Vth, the driving transistor 32 is in a cutoff state. Accordingly, the drain-source current Ids does not flow to the driving transistor 32.

Then, at time $t_5$ after time $t_4$ before time $t_6$, the horizontal selector 103 changes over the potential of the image signal line DTL from the reference potential Vofs to the signal potential Vsig which corresponds to a gradation.

Thereafter, within a writing+mobility correction period $T_5$ from time $t_6$ to time $t_7$, writing of an image signal and a mobility correction operation are carried out at the same time. In particular, within the period from time $t_6$ to time $t_7$, the potential of the scanning line WSL is set to the high potential. Consequently, the signal potential Vsig corresponding to a gradation is written into the accumulating capacitor 33 in such a form that it is added to the threshold voltage Vth. Further, the voltage ΔV for mobility correction is subtracted from the voltage retained in the accumulating capacitor 33.

Here, the gate-source voltage Vgs of the driving transistor 32 at time ty after the writing+mobility correction period $T_5$ comes to an end is Vsig+Vth-ΔV.

At time $t_7$ after the writing+mobility correction period $T_5$ comes to an end, the potential of the scanning line WSL is changed back to the low potential. Consequently, the gate of the driving transistor 32 is disconnected from the image signal line DTL and consequently is placed into a floating state. When the gate of the driving transistor 32 is in a floating state, since the accumulating capacitor 33 is connected between the gate and the source of the driving transistor 32, also the gate potential Vg varies in an interlocking relationship with the variation of the source potential Vs of the driving transistor 32. The operation of the gate potential Vg of the driving transistor 32 which varies in an interlocking relationship with the variation of the source potential Vs is a bootstrap operation by the accumulating capacitor 33.

After time $t_7$, as the gate of the driving transistor 32 is placed into a floating state and the drain-source current Ids of the driving transistor 32 begins to flow as driving current to the light emitting element 34, the anode potential of the light emitting element 34 rises in response to the driving current Ids. Also the gate-source voltage Vg of the driving transistor 32 rises similarly by a bootstrap operation. In particular, the gate potential Vg and the source potential Vs of the driving transistor 32 rise while the gate-source voltage Vgs of the driving transistor 32, which is equal to Vsig+Vth-ΔV, is kept fixed in response to the signal potential Vsig of the image signal line DTL. Then, when the anode potential of the light emitting element 34 exceeds Vthel+Vcat, the light emitting element 34 begins to emit light.

At the point of time $t_7$ after the writing+mobility correction period $T_5$ comes to an end, the correction of the threshold voltage Vth and the mobility p is completed already, and therefore, the luminance of light to be emitted from the light emitting element 34 is not influenced by a dispersion of the threshold voltage Vth or the mobility p of the driving transistor 32. In particular, the light emitting element 34 emits light with a light luminance equal among the pixels in response to the signal potential Vsig without being influenced by a dispersion of the threshold voltage Vth or the mobility p of the driving transistor 32.

Then, at time $t_8$ after a predetermined period of time elapses after time $t_7$, the potential of the image signal line DTL is dropped to the reference potential Vofs from the signal potential Vsig.

In each of the pixels 101 of the EL panel 100, the light emitting element 34 can be driven to emit light without being influenced by the threshold voltage Vth or the mobility p of the driving transistor 32 in such a manner as described above. Accordingly, with the display apparatus 1 which uses the EL panel 100, a display image of high quality can be obtained.

Now, before a pattern structure at a thin film transistor portion of the pixel 101 of the EL panel 100 is described, a pattern structure of a thin film transistor portion hitherto known is described.

It is to be noted that, if a pattern structure at a thin film transistor portion of the pixel 101 of the EL panel 100 is compared with a pattern structure of a thin film transistor portion hitherto known, then it is different in the location of several films. In other words, since the configuration itself of films formed on a substrate is not different among them, description of the pattern structure of a thin film transistor portion hitherto known shown in FIGS. 5 and 6 is given using reference characters similar to those of the pixel 101 of the EL panel 100.

[Cross Section at a Driving Transistor 32 Portion of a Pixel 101 Hitherto Known]

Figure 5:
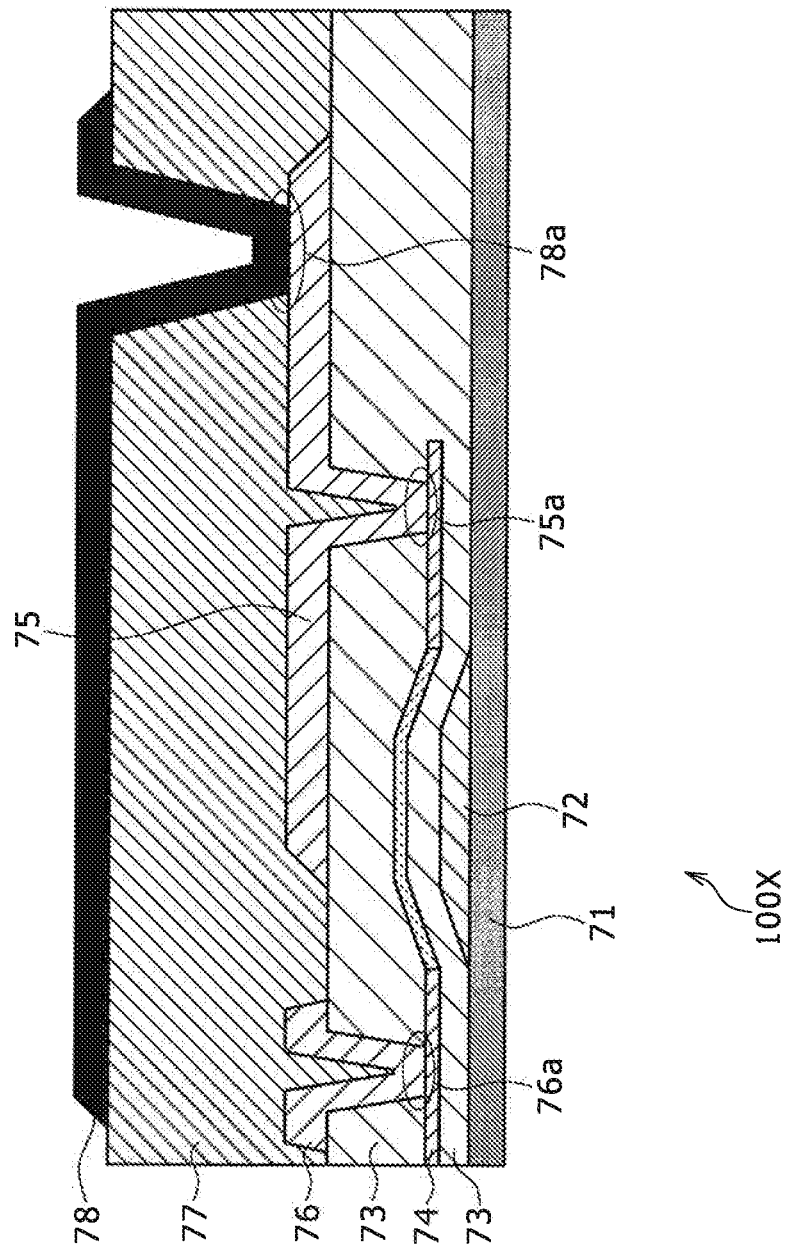
FIG. 5 is a schematic sectional view of a driving transistor of an EL panel hitherto known.
Figure 6:
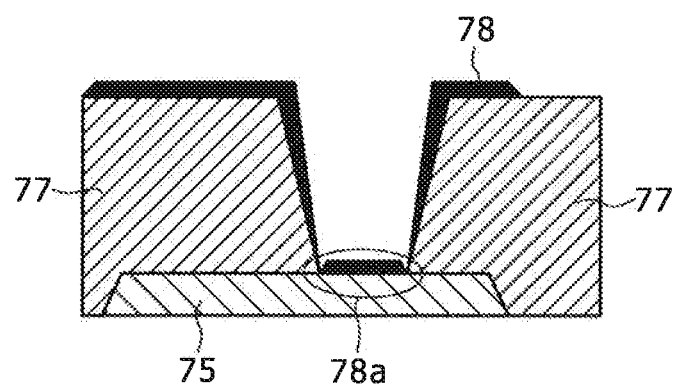
FIG. 6 is a schematic sectional view illustrating a step appearing in a film.

FIG. 5 shows a cross section at a driving transistor 32 portion of the pixel 101 of an EL panel 100X hitherto known.

Referring to FIG. 5, in the EL panel 100X, a gate electrode 72 of a driving transistor 32 is formed on a supporting substrate 71 made of a material such as glass. A polycrystalline silicon film 74 as a semiconductor layer which forms a channel region is formed on the upper side of the gate electrode 72 with an insulating film 73 interposed therebetween.

A source electrode 75 and a drain electrode 76 are formed on the upper side of the polycrystalline silicon film 74. The source electrode 75 is connected at a contact portion 75a thereof to the polycrystalline silicon film 74. The drain electrode 76 is connected at a contact portion 76a thereof to the polycrystalline silicon film 74. The insulating film 73 is interposed between the source electrode 75 and the polycrystalline silicon film 74 and between the drain electrode 76 and the polycrystalline silicon film 74 except the contact portions 75a and 76a.

A flattening film 77 is laminated on the source electrode 75 and the drain electrode 76, and an anode electrode 78 which is a reflecting electrode is formed on the flattening film 77. The anode electrode 78 is connected at a contact portion 78a thereof to the source electrode 75.

An organic EL film not shown which is a light emitting layer for emitting light of a predetermined color from among red, green and blue is formed on the upper side of the anode electrode 78, and a cathode electrode not shown is formed on the organic EL layer.

[Problem of the Pixel Hitherto Known]

In the pixel 101 hitherto known, the contact portion 78a which is a connecting layer between the anode electrode 78 and the source electrode 75 and the contact portion 75a which is a connecting layer between the source electrode 75 and the polycrystalline silicon film 74 are disposed at positions spaced from each other in a planar direction. This is because, if the distance of an inclined portion for connecting the conductive layers to each other, which is hereinafter referred to offset portion is long, then the possibility that contact failure such as a step may appear becomes high. The step signifies a phenomenon that a film formed at an offset portion becomes so thin that it gives rise to disconnection as seen in FIG. 6.

As a material for the anode electrode 78, a film of a lamination structure wherein, for example, a transparent conductive film such as an ITO film is laminated on the opposite faces of a thin film of aluminum (Al) or silver (Ag) in such a manner as to sandwich the thin film. While a film of a lamination structure which uses silver has a merit that it achieves a higher reflection factor than aluminum, from a characteristic of the material, however, a step of the silver thin film or a step of a transparent conductor film is likely to occur. If a step or film formation failure of the silver thin film or a transparent conductive film appears, then the connection resistance becomes high or the silver is corroded, resulting in failure in achievement of good contact.

Customarily, in order to prevent such contact failure, the contact portion 78*a* and the contact portion 75*a* are disposed at positions spaced from each other in a planar direction as seen in FIG. 5.

However, to dispose the contact portion 78*a* and the contact portion 75*a* at positions spaced from each other in a planar direction involves a large layout area and makes an obstacle where it is intended to reduce the area of one pixel. In other words, since the contact portion 78*a* and the contact portion 75*a* are spaced from each other in a planar direction, there is a problem that it is difficult to achieve a high definition of the EL panel. Further, where there is no necessity to change the area of one pixel, since the layout area including the contact portion 78*a* and the contact portion 75*a* becomes great, it cannot be avoided to reduce the layout area of the other components. This deteriorates the display performance in terms of improvement in luminance or driving with saved power.

[Top Plan of the Pixel 101 Hitherto Known]

In the following description, a metal layer which is positioned on the lowermost face in the cross sectional view of FIG. 5 and forms the gate electrode 72 is referred to as lower face metal layer for the convenience of description. Further, the semiconductor layer which forms the polycrystalline silicon film 74 is hereinafter referred to as silicon layer, the metal layer which forms the source electrode 75 and the drain electrode 76 as intermediate metal layer, and the metal layer which forms the anode electrode 78 as upper face metal layer.

Figure 7:
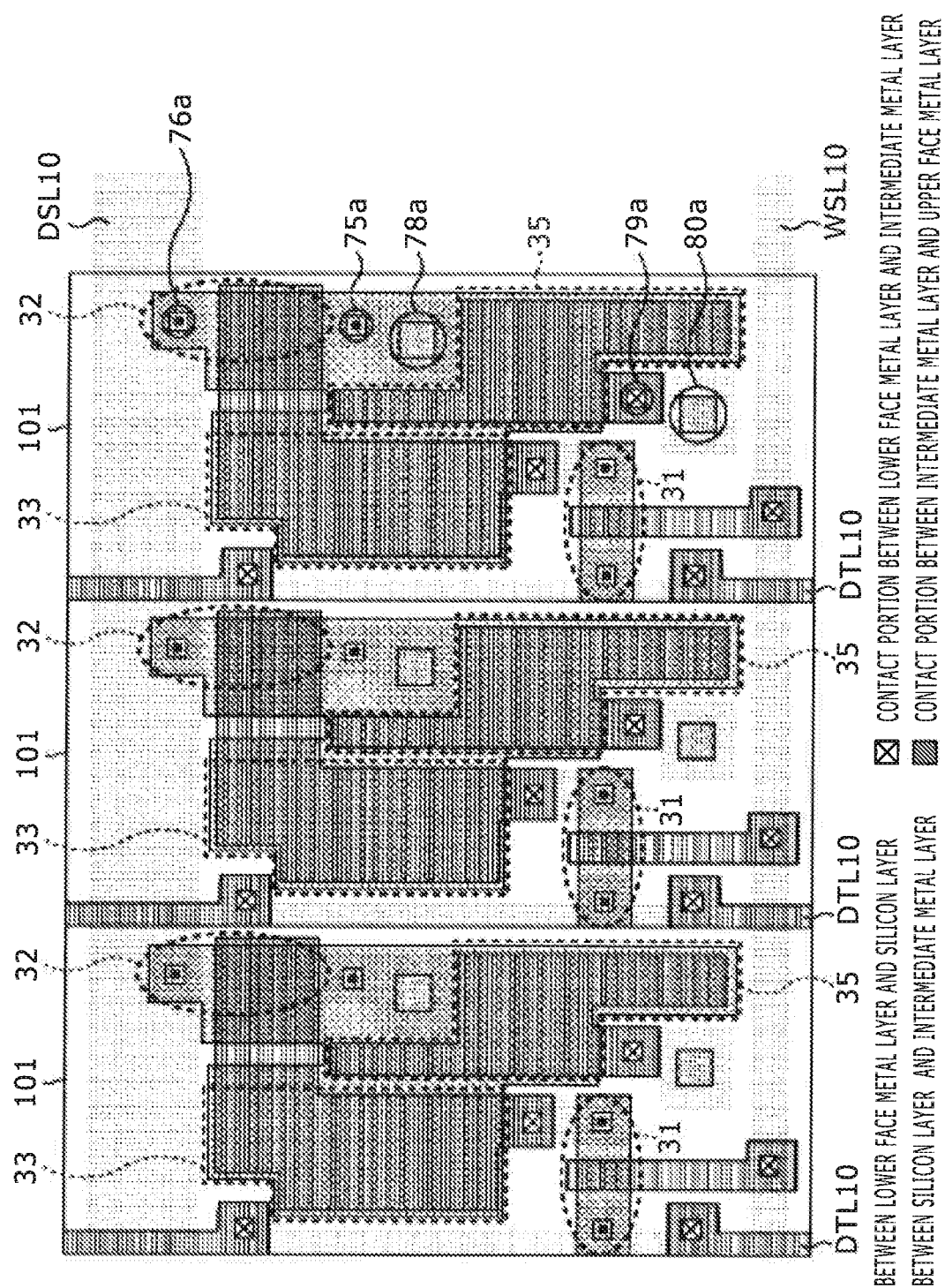
FIG. 7 is a plan view of pixels from which an EL panel hitherto known is formed.

Referring to FIG. 7, the scanning line WSL10 and the power supply line DSL10 which traverse the pixels 101 are formed from the intermediate metal layer. Further, the image signal line DTL10 which traverses the pixels 101 is formed, at portions thereof which do not intersect with the scanning line WSL10 and the power supply line DSL10, from the intermediate metal layer but is formed, at portions thereof which intersect with the scanning line WSL10 and the power supply line DSL10, from the lower face metal layer.

If attention is paid to a sampling transistor 31, then the drain electrode and the source electrode of the sampling transistor 31 are formed from the intermediate metal layer, and the gate electrode of the sampling transistor 31 is formed from the lower face metal layer. Further, a silicon layer is formed between the drain electrode and source electrode and the gate electrode of the sampling transistor 31. The silicon layer is connected to the intermediate metal layer as the drain electrode and the source electrode of the sampling transistor 31.

If attention is paid to a driving transistor 32, then the drain electrode and the source electrode of the driving transistor 32 are formed from the intermediate metal layer, and the gate electrode of the driving transistor 32 is formed from the lower face metal layer. Further, a silicon layer is formed between the drain electrode and source electrode and the gate electrode of the driving transistor 32. The silicon layer is connected to the intermediate metal layer as the drain electrode and the source electrode of the driving transistor 32.

The intermediate metal layer which forms the drain electrode of the driving transistor 32 is connected to the silicon layer as the polycrystalline silicon film 74 through the contact portion 76*a*. The intermediate metal layer which forms the source electrode of the driving transistor 32 is connected to the silicon layer as the polycrystalline silicon film 74 through the contact portion 75*a*. Further, the intermediate metal layer which forms the source electrode of the driving transistor 32 is connected to the anode electrode 78 through the contact portion 78*a*.

The accumulating capacitor 33 is formed from the lower face metal layer and the silicon layer which are disposed in an opposing relationship to each other. One of the electrodes of the accumulating capacitor 33 formed from the lower face metal layer is connected to the source electrode of the sampling transistor 31 through the intermediate metal layer. The other electrode of the accumulating capacitor 33 formed from the silicon layer is connected to the intermediate metal layer which forms the source electrode of the driving transistor 32. Since the intermediate metal layer which forms the source electrode of the driving transistor 32 is connected to the anode electrode 78 as described above, after all the other electrode of the accumulating capacitor 33 formed from the silicon layer is connected to the anode electrode 78.

Also the auxiliary capacitor 35 is formed from the lower face metal layer and the silicon layer which are disposed in an opposing relationship to each other. Since one of the electrodes of the auxiliary capacitor 35 is formed from the silicon layer common to the other electrode of the accumulating capacitor 33, it is connected to the anode electrode 78. The other electrode of the auxiliary capacitor 35 is connected to the intermediate metal layer through a contact portion 79*a*, and the intermediate metal layer is connected to the anode electrode 78 through a contact portion 80*a*. Here, the potential of the contact portion 78*a* connected through the contact portion 80*a* electrically is the potential Vcat.

The pixel 101 of the EL panel 100X hitherto known is configured in such a manner as described above, and the contact portion 75*a* and the contact portion 78*a* are positioned in a spaced relationship from each other. Therefore, the intermediate metal layer which forms the source electrode of the driving transistor 32 and has the two contact portions 75*a* and 78*a* has a large area.

Further, since the contact portions 79*a* and 80*a* are positioned in a spaced relationship from each other, also the intermediate metal layer which has the contact portions 79*a* and 80*a* has a large area.

Accordingly, the disposition configuration hitherto known has a problem in that it is difficult to achieve a high definition of an EL panel or alternatively deterioration in function such as driving by improvement in luminance or by power saving is invited.

Thus, a first embodiment of the pixel 101 which is adopted in the EL panel 100 to which the present invention is applied is described.

First Embodiment

[Cross Section at a Driving Transistor 32 Portion of the Pixel 101 of the EL Panel 100]

Figure 8:
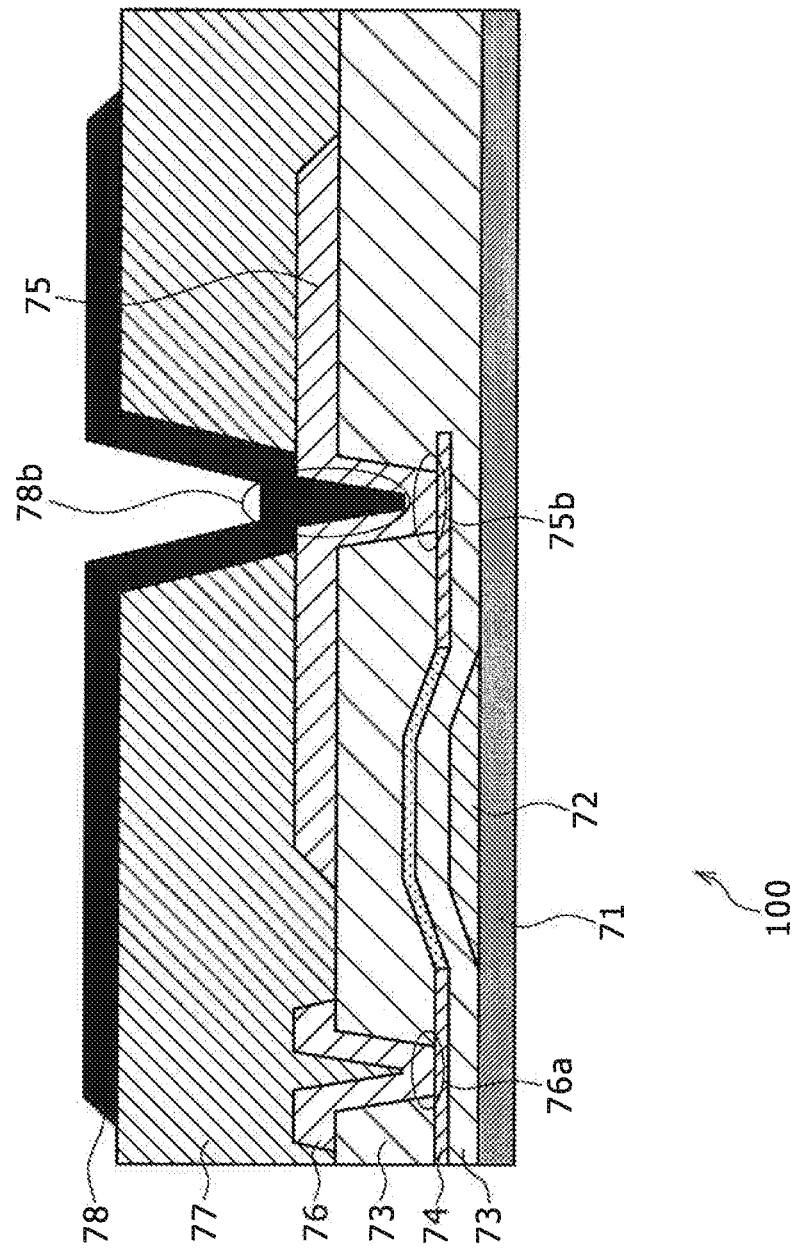
FIGS. 8 and 9 are sectional views of a driving transistor of a pixel in first and second embodiments of the EL panel of FIG. 1.

FIG. 8 shows a cross section at a driving transistor 32 portion of the pixel 101 of the first embodiment.

Referring to FIG. 8, in the pixel 101 shown, a contact portion 78*b* which is a connecting portion between the anode electrode 78 and the source electrode 75 of the driving transistor 32 and a contact portion 75*b* which is a connecting portion between the source electrode 75 and the polycrystalline silicon film 74 are disposed at the same position in a planar direction. In other words, the contact portions 78*b* and 75*b* are disposed such that the center positions thereof as viewed from above are same as each other, that is, are coaxial.

Consequently, the area of the intermediate metal layer having the contact portions 75*b* and 78*b* can be reduced, and the area in one pixel can be utilized effectively or the area of one pixel can be reduced.

However, in the disposition of FIG. 8, another offset portion is provided on an offset portion. More particularly, the anode electrode 78 is connected to an inclined portion at which the source electrode 75 is connected to the polycrystalline silicon film 74. Therefore, it can be recognized that a step is liable to appear.

Second Embodiment

Thus, a second embodiment of the pixel 101 of the EL panel 100 which suppresses appearance of contact failure better is described.

[Cross Section at a Driving Transistor 32 Portion of the Pixel 101 of the EL Panel 100]

Figure 9:
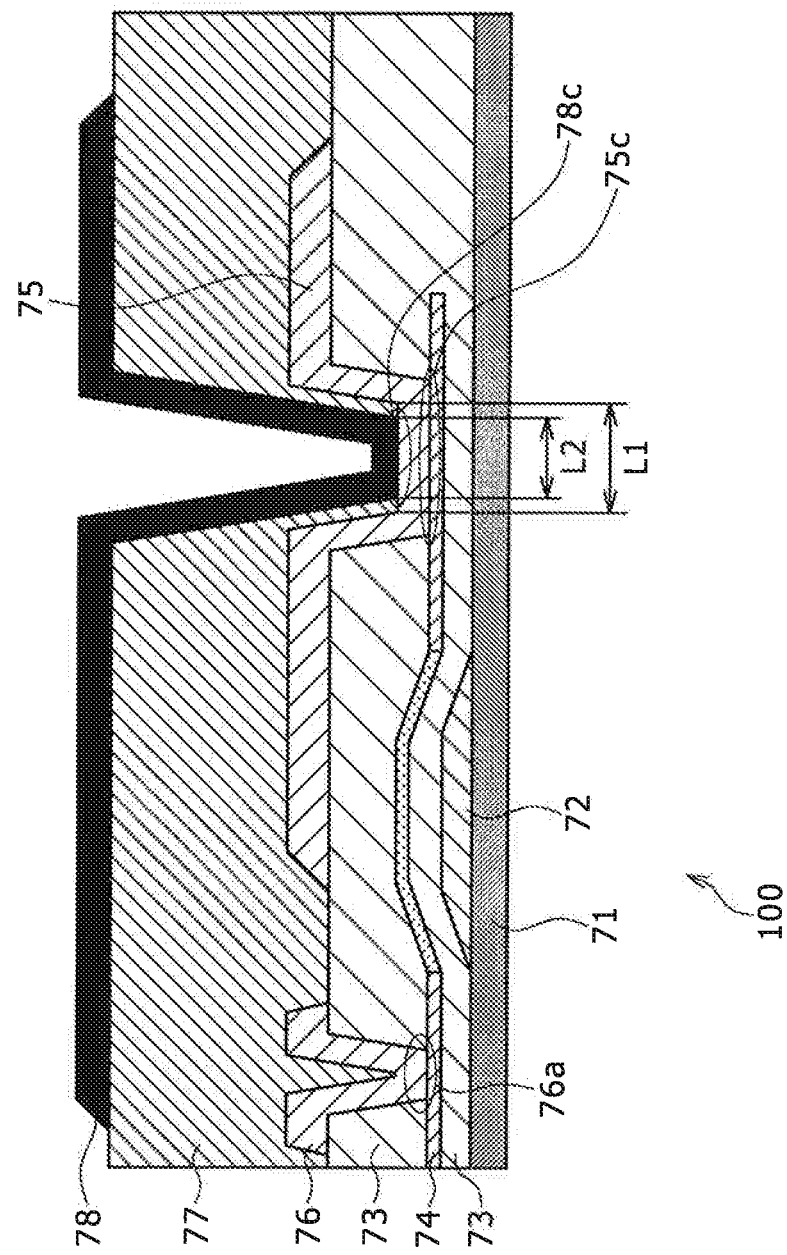

FIG. 9 shows a cross section at a driving transistor 32 portion of the pixel 101 of the second embodiment.

Also in the pixel 101 of FIG. 9, a contact portion 78*c* which is a connecting portion between the anode electrode 78 and the source electrode 75 of the driving transistor 32 and a contact portion 75*c* which is a connecting portion of the source electrode 75 and the polycrystalline silicon film 74 are disposed at the same position in a planar direction.

Further, in the pixel 101 of FIG. 9, a film face on the upper side of the source electrode 75 which forms the contact portion 75*c* has a flattened face, and the source electrode 75 and the anode electrode 78 are connected as the contact portion 78*c* to each other on the flattened face. In other words, the faces of the source electrode 75 and the anode electrode 78 contact with each other.

Further, the opening width L1 of the flattened face on the source electrode 75 side on the same plan which forms the contact portion 78*c* is greater than the opening width L2 of the flattened face of the anode electrode 78.

[Top Plan of the Contact Portion 78*c*]

FIG. 10 shows top plans of the contact portion 78*c*.

The contact portion 78*c* can be formed in a quadrangular shape or a circuit shape as seen in FIG. 10. In this instance, also the flattened face on the source electrode 75 side has the same shape, that is, the same quadrangular shape or circular shape, with the contact portion 78*c*.

Meanwhile, the opening width L1 of the flattened face on the source electrode 75 side can be formed greater, for example, by more than 1 μm than the opening width L2 of the flattened face of the anode electrode 78.

Where the upper side film face of the source electrode 75 is provided with a flattened face and the anode electrode 78 and the source electrode 75 are connected to each other on the flattened face as described above, a connecting face similar to that at the known contact portion 78*a* shown in FIG. 5 is assured. Accordingly, contact failure can be prevented.

[Top Plan of the EL Panel 100]

FIG. 11 shows a top plan of the EL panel 100 of the second embodiment. It is to be noted that, in the example of FIG. 11, the contact portions 75*c* and 78*c* are formed in a quadrangular shape.

Referring to FIG. 11, the contact portions 75*c* and 78*c* are disposed at one place at a position on the lower side of the plan of the figure of the driving transistor 32. Consequently, where the example in FIG. 11 is compared with that of FIG. 7, the intermediate metal layer which has the contact portions 75*c* and 78*c* has a reduced area.

Also contact portions 79*c* and 80*c* which correspond to the contact portions 79*a* and 80*a* shown in FIG. 7, respectively, are disposed at the same position in a planar direction similarly. Therefore, the intermediate metal layer of them has a reduced area.

Since the intermediate metal layer having the contact portions 75*c* and 78*c* and the intermediate metal layer having the contact portions 79*c* and 80*c* individually have reduced areas, the area of the auxiliary capacitor 35 in FIG. 11 can be increased in comparison with that in FIG. 7.

As described above, with the EL panel 100, the contact portion 75*c* between the silicon layer or first conductive layer and the intermediate metal layer or second conductive layer and the contact portion 78*c* between the intermediate metal layer and the upper face metal layer or third conductive layer are disposed at the same position in a planar direction. Consequently, the area of the intermediate layer having the two contact portions, that is, the contact portions 75*c* and 78*c*, can be reduced, and the area of one pixel can be reduced. On the other hand, where there is no necessity to change the area of one pixel, the display performance can be improved.

Further, with the EL panel 100, the contact portion 75*c* between the silicon layer or first conductive layer and the intermediate metal layer or second conductive layer has a flattened face, and the contact portion 78*c* between the intermediate layer and the upper face metal layer or third conductive layer is disposed on the flattened face. Consequently, not only where the material of the anode electrode 78 is aluminum (Al) but also where a film of a laminate structure using silver is adopted, contact failure such as a step can be prevented.

The embodiment of the present invention is not limited to the specific embodiment described hereinabove but can be modified in various manners without departing from the subject matter of the present invention.

Although the pixel 101 is configured from two transistors such as the sampling transistor 31 and the driving transistor 32 and two capacitors such as the accumulating capacitor 33 and the auxiliary capacitor 35, also it is possible to adopt a different circuit configuration.

For example, since the auxiliary capacitor 35 is provided in order to complement a capacitance component of the light emitting element 34, it can be omitted. Accordingly, the pixel 101 can be configured from two transistors and a single transistor such as the accumulating capacitor 33, that is, as a 2Tr/1C pixel circuit.

Further, as a different circuit configuration of the pixel 101, for example, the following circuit configuration can be adopted. In particular, it is possible to adopt a configuration which includes first to third transistors in addition to a 2Tr/1C pixel circuit, that is, five transistors and one capacitor. The configuration just described is hereinafter referred to as 5Tr/1C pixel circuit. Where the pixel 101 adopts the 5Tr/1C pixel circuit, the signal potential to be supplied from the horizontal selector 103 to the sampling transistor 31 through the image signal line DTL10 is fixed to the signal potential Vsig. As a result, the sampling transistor 31 only functions to switch supply of the signal potential Vsig to the driving transistor 32. Further, the potential to be supplied to the driving transistor 32 through the power supply line DSL10 is fixed to the first potential Vcc. Further, the first transistor newly added switches supply of the first potential Vcc to the driving transistor 32. The second transistor switches supply of the second potential Vss to the driving transistor 32. Further, the third transistor switches supply of the reference potential Vofs to the driving transistor 32.

Further, as another different circuit configuration of the pixel 101, an intermediate configuration between the 2Tr/1C pixel circuit and the 5Tr/1C pixel circuit may be adopted. In particular, a configuration which includes four transistors and one capacitor, that is, a 4Tr/1C pixel circuit, or a configuration which includes three transistors and one capacitor, that is, a 3Tr/1C pixel circuit, can be adopted. The 4Tr/1C pixel circuit may be configured such that, for example, the third transistor of the 5Tr/1C pixel circuit is omitted and the signal potential to be supplied from the horizontal selector 103 to the sampling transistor 31 is formed as a pulse signal using the signal potential Vsig and the reference potential Vofs.

The 3Tr/1C pixel circuit, 4Tr/1C pixel circuit and 5Tr/1C pixel circuit may additionally include the auxiliary capacitor 35 similarly to the 2Tr/1C circuit.

The present application contains subject matter related to that disclosed in Japanese Priority Patent Application JP 2009-097083 filed in the Japan Patent Office on Apr. 13, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display apparatus comprising:
a plurality of pixels,
wherein each of the pixels comprises
a driving transistor configured to drive a light emitting element,
a sampling transistor configured to sample an image signal, and
a capacitor,
wherein
a control terminal of the driving transistor and a first electrode of the capacitor are disposed at a first metal layer,
a first terminal and a second terminal of the driving transistor are disposed at a semiconductor layer,
an anode electrode of the light emitting element is disposed at a third metal layer,
a portion of the semiconductor layer is connected to a first portion of a second metal layer at a first contact hole,
a portion of the third metal layer is connected to a second portion of the second metal layer at a second contact hole,
the first contact hole is partially overlapped with the second contact hole, and
the second metal layer is disposed at between the semiconductor layer and the third metal layer.

2. The display apparatus according to claim 1, wherein the capacitor is connected between the control terminal and the first terminal of the drivin transistor.

3. The display apparatus according to claim 1, wherein a voltage line is electrically connected to the second terminal of the driving transistor.

4. The display apparatus according to claim 3 wherein the voltage line is disposed at the second metal layer.

5. The display apparatus according to claim 1, wherein the semiconductor layer is disposed between the first metal layer and the second metal layer.

6. The display apparatus according to claim 1, wherein a first capacitor is connected between the anode electrode of the light emitting element and a potential line.

* * * * *